(12) United States Patent
Kose

(10) Patent No.: US 7,975,189 B2
(45) Date of Patent: Jul. 5, 2011

(54) ERROR RATE ESTIMATION/APPLICATION TO CODE-RATE ADAPTION

(75) Inventor: Cenk Kose, La Jolla, CA (US)

(73) Assignee: TrelliWare Technologies, Inc., San Diego, CA (US)

( * ) Notice: Subject to any disclaimer, the term of this patent is extended or adjusted under 35 U.S.C. 154(b) by 299 days.

(21) Appl. No.: 12/271,050

(22) Filed: Nov. 14, 2008

(65) Prior Publication Data

US 2010/0125764 A1 May 20, 2010

(51) Int. Cl.
*G06F 11/00* (2006.01)
(52) U.S. Cl. .......................... 714/704; 714/701
(58) Field of Classification Search .................... 725/70; 375/225, 222, 260; 714/704, 241, 701
See application file for complete search history.

(56) References Cited

U.S. PATENT DOCUMENTS

| | | | | |
|---|---|---|---|---|
| 6,535,551 | B1 * | 3/2003 | Sweitzer et al. | 375/225 |
| 6,570,915 | B1 * | 5/2003 | Sweitzer et al. | 375/225 |
| 6,654,410 | B2 * | 11/2003 | Tzannes | 375/222 |
| 6,829,294 | B2 * | 12/2004 | Sweitzer et al. | 375/225 |
| 7,508,876 | B2 * | 3/2009 | Tzannes | 375/260 |

OTHER PUBLICATIONS

S. Benedetto, D. Divsalar, G. Montorsi, F. Pollara, "Serial concatenation of interleaved codes: Performance analysis, design and iterative decoding", *IEEE Trans. Info. Theory* vol. 44, No. 3, pp. 909-926, May 1998.

C. Berrou, A. Glavieux, P. Thitimajshima, "Near Shannon Limit Error-Correcting Coding and Decoding: Turbo Codes", *Proc. Intern. Conf. on Communications*, ICC 1993, pp. 1064-1070, 1993.
K. M. Chugg, P. Thienviboon, G, D, Dimou, P. Gray, J. Melzer, "A new class of turbo-like codes with universally good performance and high-speed decoding", *Proc. IEEE Military Comm. Conf.*, Atlantic City, NJ, Oct. 2005.
S. Chung, T. J. Richardson, R. Urbanke, "Analysis of Sum-Product Decoding of Low-Density Parity-Check Codes Using a Gaussian Approximation", *IEEE Trans. Inform. Theory*, vol. 47, pp. 657-670, Feb. 2001.
R. A. Comroe, D. J. Costello, "ARQ schemes for data transmission in mobile radio systems", Jr, *IEEE. Trans. Vehicular Technology*, vol. VT-33, No. 3, Aug. 1984, pp. 88-97.
A. P. Dempster, N. M. Laird, D.B Rubin, "Maximum likelihood from imcomplete data via the EM algorithm", *Journal of the Royal Statistical Society* B, 39(1):1-22, 1977.
S. Dolinar, D. Divsalar, F. Pollara, "Code performance as a function of block size", *The Telecommunications and Mission Operations Progress Report*, TMO PR 42-133, Jan.-Mar. 1998, pp. 1-23.
R. G. Gallager, *Low-density parity-check codes*, Ph.D. Dissertation, M.I.T., Cambridge, MA, 1963.

(Continued)

*Primary Examiner* — David Ton
(74) *Attorney, Agent, or Firm* — Kilpatrick Townsend & Stockton LLP

(57) ABSTRACT

The disclosure proposes bit-error-rate (BER) and symbol-error-rate (SER) estimation techniques and its application to incremental-redundancy and rate-adaptation for modern-coded hybrid-ARQ systems. In particular, BER/SER estimators are proposed based on iterative refinement of mixture-density modeling of the bit/symbol decision metrics. For hybrid-ARQ systems, rate-adaptation functions are proposed based on BER/SER estimators for failed transmissions. Methods are disclosed for code-rate selection based on successfully decoded blocks as well as incremental parity size selection for retransmission of failed blocks Techniques disclosed here apply to forward-error-correction codes employed for digital data communication systems.

30 Claims, 8 Drawing Sheets

OTHER PUBLICATIONS

H. Jin, A. Khandekar, R. McEliece, "Irregular repeat- accumulate codes", *Proc. Inter. Symp. on Turbo codes and Related Topics*, Sep. 2000, pp. 1-8.

R. Mantha, F. R. Kschischang, "A capacity-approaching hybrid ARQ scheme using turbo codes", *Proc. IEEE Global Communications Conf*, Globecom 99, pp. 2341-2345.

R. M. Pyndiah, "Near-optimum decoding of product codes: Block turbo codes", *IEEE Trans. Comm.* vol. 46, No. 8, pp. 1003-1010, Aug. 1998.

J. Richardson, A. Shokrollahi, and R. Urbanke, "Design of capacity-approaching low-density parity-check codes", IEEE Trans. Inform. Theory, vol. 47, pp. 619-637, Feb. 2001.

\* cited by examiner

ERROR RATE ESTIMATION/APPLICATION TO CODE-RATE ADAPTION

BACKGROUND OF THE INVENTION

The disclosure relates generally to error correction techniques for data communications and more specifically to forward error correction techniques.

1.1 Forward Error Correction and Modern Codes

Forward error correction (FEC) (also known as channel coding) is an indispensable part of modern digital communication systems, especially wireless digital communication systems where the information-bearing signals undergo severe distortion during propagation through the wireless medium (channel). Forward error correction helps combat such deleterious effects by introducing structured redundancy in the transmitted signals.

When describing the operation of FEC, information messages are often modeled as K-bit words $b=(b_1, b_2, \ldots, b_K)$, where each message bit $b_k$ can assume one of two values, '0' or '1'. The vector b is called a binary message (data) block. A binary (N, K) FEC code (also known as a channel code) is a collection of $2^K$ N-bit codewords where N>K such that one codeword corresponds to each possible message word. An binary FEC encoder (referred to herein simply as an encoder) for an (N,K) binary FEC code maps a K-bit message block $b=(b_1, b_2, \ldots b_K)$ to an N-bit codeword $c=(c_1, c_2, \ldots c_N)$ in a deterministic fashion. In a binary systematic code the message block appears explicitly as part of the corresponding codeword, e.g. $c_1=b_1, c_2=b_2, \ldots, c_K=b_K$. In a systematic codeword, bits other than message bits are called parity bits. The number of parity bits in a systematic code is, therefore, P=N−K. The code rate of a (N,K) code is defined to be R=K/N=K/(K+P). Lower code rates indicate higher redundancy (more parity) as compared to higher code rates.

A binary FEC decoder performs the inverse operation by estimating the intended message word from the received word. The received word is denoted by $\lambda_{in}=(\lambda_{in,1}, \lambda_{in,2}, \ldots, \lambda_{in,N})$, where $\lambda_{in,j}$ is the received value for the jth codeword bit as input to the decoder. The received values summarize the effects of all operations performed starting from the output of the encoder on the transmit-side, to the input of the decoder on the receive-side, such as modulation, transmission through the physical channel, demodulation. In general the received values may or may not be binary (i.e. '0' or '1'). If $\{\lambda_{in,j}\}$ values are binary, the decoder is said to have hard-inputs, otherwise it is said to have soft-inputs. A common example of soft-inputs is the log-likelihood ratios for codeword bits which take values other than '0' or '1'. The log-likelihood ratio (LLR) of a bit is the natural logarithm of the ratio of the empirical (computed) probability that the bit has the value '0', to the empirical probability that the bit has the value '1'.

$$\lambda_{in,k} = \log \frac{p(c_k = 0)}{p(c_k = 1)} \quad (1.1.1)$$

Other variants of soft-information input to the decoder, such as probability values, are equivalent to LLRs in the sense that one can be obtained from the other, for example, $p(c_k=0)=1/(1+\exp(-\lambda_{in,k}))$. For this reason, without loss of generality, soft-information regarding a particular bit is assumed to be a log-likelihood-ratio.

Since the introduction of the (binary) turbo decoder which demonstrated unprecedented near-capacity performance, modern binary codes with related structure (low-density parity-check codes, serially-concatenated convolutional codes, repeat-accumulate codes and variants, turbo-product codes, etc.) has been a popular topic of research and development. Decoders for modern or turbo-like codes (operate by computing a posteriori LLRs or equivalent metrics for the message bits based on the input soft information $\lambda_{in}$. We denote this output soft-information as $$\lambda_k \approx \log \frac{p(b_k = 0 \mid \{\lambda_{in,n}, n = 1, \ldots, N\})}{p(b_k = 1 \mid \{\lambda_{in,n}, n = 1, \ldots, N\})} \quad (1.1.2)$$

where $\approx$ indicates the fact that the computation of the right-hand side of equation (1.1.2) may be inexact for a practical decoder. Bit decisions are delivered by looking at the sign of the output metrics of equation (1.1.2), therefore they are also called as bit decision-metrics. A positive value of a bit decision metric (as defined by equation (1.1.2)) yields a decision of '0', whereas a negative value results in a bit decision '1'.

The number of bit errors in the decoded block is denoted by $K_E$. The instantaneous bit-error-rate (BER) is defined to be the fraction of bits in error for a particular block, and is denoted by equation (1.1.3):

$$\mu_E = \frac{K_E}{K} \quad (1.1.3)$$

Non-Binary Codes

In addition to binary codes, non-binary codes may also be constructed in which information symbols $\{b_k, k=1, \ldots, K\}$ belong to an alphabet $F_b$ and codeword symbols $\{c_n, n=1, \ldots, N\}$ belong to an alphabet $F_c$, and at least one of $F_b$ and $F_c$ is non-binary. A non-binary code can be regarded as systematic if there is a one-to-one function $f: F_b^M \to F_c$ such that $f(b_{mM+1}, b_{mM+2} b_{(m+1)M})=c_m$, m=1, 2, ... K, i.e. if the information symbols can be grouped in M-tuples to produce the systematic codeword symbols, where $M=\log|F_c|/\log|F_b| \geq 1$. In this case, the code can be regarded as a systematic code with rate R=K/(K+PM) where P=(N−K). The quantity P can be regarded as the number of parity symbols. For example, if $F_1=\{0,1\}$ (binary) and $F_c=\{0,1,2,3\}$, and $c_k=2b_{2k}+b_{2k+1}$ (M=2), the codeword symbols $c_1, c_2, \ldots c_K$ are systematic symbols.

For a non-binary systematic code, the decoder may accept lists of symbol probabilities $\vec{\lambda}_{in,n}=\{p(c_n=c), c \in F_c\}$, n=1, ..., N, as input and compute output symbol probabilities for the systematic symbols, $\{p(c_k=c | \{\vec{\lambda}_{in,n}, n=1, \ldots, N\})$, $c \in F_c\}$ for k=1, 2, ... K. Contrary to the binary-alphabet case, the set of probabilities for a non-binary symbol alphabet cannot be summarized by a single scalar value.

A list of |F|−1 probability values should be maintained for each symbol for an alphabet size of |F|. The a posteriori symbol probabilities can then be computed by simply summing over those output symbol probabilities which are consistent with the symbol value. Mathematically, $$p(b_{mM+i} = b \mid \{\vec{\lambda}_{in,n}, n = 1, \ldots, N\}) = \sum_{c \in S_i(b)} p(c_k \mid \{\vec{\lambda}_{in,n}, n = 1, \ldots, N\}) \quad (1.1.4)$$

where $S_i(b)$ is the subset of $F_c$ consisting of those c values for which $c=f(b_{mM+1} b_{mM+2} b_{(m+1)M})$ with $b_{mM+i}=b$. The decoder would then deliver symbol estimates for input symbol $b_m$ by choosing the most-likely symbol, i.e. the decoder would declare $b_m=b_{EST,m}$ where $b_{EST,m}=\arg \max_{b \in Fb} p(b_{mM+i}=b | \{\vec{\lambda}_{in,n}, n=1, \ldots, N\})$. In this case, an instantaneous symbol error rate (SER) can be computed analogously to equation (1.3), as the ratio of erroneous input symbols in the decoded block.

1.2 Adaptive-Coding and Incremental/Decremental Redundancy

Digital communication systems can benefit from using multiple code-rates by using lower code rates when the channel is unreliable, thereby reducing the probability of erroneous reception, and by using higher code rates when the channel is favorable, limiting the amount of overhead for reliable communication. The use of different code rates for matching the channel reliability is referred to as adaptive coding. Adaptive coding is a particular means of link adaptation, which is a generic term for methods of changing the attributes of a transmitted signal based on the conditions of the radio link. In adaptive coding, the signal attribute that is changed is the code rate.

The implementation of adaptive coding is facilitated by the use of a systematic (K+P, K) binary code, in which subsets of parity bits are punctured to achieve higher rates than the mother code rate $R=K/(K+P)$. Punctured parity bits are not transmitted as part of the final codeword. On the receive-end, the decoder simply depunctures the corresponding punctured bits by declaring a zero input soft-information for the corresponding locations of the received word. For an input message size of K bits, a family $\Re$ of code rates can be obtained by varying the amount of puncturing:

$$\Re = \left\{ R_i = \frac{K}{K+P_i} : 0 < P_i \leq P_{max} \right\} \quad (1.2.1)$$

Such a family of codes is called a rate-compatible systematic code family. An example of a rate-compatible systematic code family is the Flexible-LDPC (F-LDPC) codes of TrellisWare Technologies.

Adaptive coding (as all forms of link-adaptation) assumes feedback from the receive-side to the transmit-side regarding prevalent channel conditions. In its simplest form, the feedback information from the receive-side is an acknowledgement (ACK) message for a block or groups of blocks that are estimated to be error-free by means of an outer error-detection encoding circuit (separate from the FEC which may or may not exist). The arrival of a negative acknowledgement (NAK) message at the transmit-side is interpreted as a failure and retransmission of blocks is requested. This is the operation principle of the basic Automatic Repeat reQuest (ARQ) protocol.

When the communication system has a (systematic) FEC code, a hybrid-ARQ (H-ARQ) protocol can be employed for increased efficiency. In type-II H-ARQ, a block of message bits are first transmitted without the parity bits originating from the FEC, with only extra bits originating from the error-detection scheme. If error detection passes on the receive side, an ACK is sent. If the receive-side error detection indicates presence of errors (failed block), a NAK is issued and a retransmission of only parity bits (originating from the encoding of the message bits and the error-detection bits) is generated. If parity transmission fails as well, the algorithm repeats and message bits (as well as error detection bits) are retransmitted. The decoder can then combine the two copies of received message words to achieve a greater reliability.

When the system is equipped with a rate-compatible systematic FEC, a finer resolution of code rates could be used for retransmissions, by incrementally transmitting more parity bits until error-detection passes. This general incremental parity-retransmission scheme is known as incremental-redundancy protocol. An incremental-decremental redundancy scheme comprises a method for determining the incremental parity size following a NAK, and a method for determining the code-rate to be used for a new data packet following an ACK. The latter rate is called the initial transmission rate.

The efficacy of an incremental-redundancy scheme is determined by its average throughput, which is the average amount of information transmitted per unit time. The throughput usually includes penalties for extra parity requests as well as retransmissions.

If the incremental parity step is too small, it may take many parity requests and retransmissions to receive an ACK, and the average throughput is diminished by the protocol overhead. Even though the throughput cost of a parity request may be low, significant latency for successful decoding of blocks may hinder practicality. If the parity step is too large, the FEC may be operating in a much lower rate than it could, leading to reduced throughput through unnecessarily high number of parity bits during favorable communication conditions.

One shortcoming of the aforementioned incremental-redundancy scheme is the inability to adjust to improving channel conditions. Consider a scenario where the channel condition is improving during the course of a series of transmitted blocks, so that blocks could be encoded using fewer parity bits (less redundancy) while being successfully decoded. However, after the receiving of an ACK for the one of these blocks, an incremental-redundancy scheme may not be able to reduce the overhead for subsequent blocks unless the transmit side goes through all the incremental-parity steps starting from the highest code-rate (which may just be uncoded transmission), causing a significant reduction in throughput.

Techniques that overcome these and other shortcomings of conventional coded ARQ techniques are desired.

SUMMARY

Embodiments of the disclosure provide techniques for forward-error correction. System and methods are provided for determining the retransmission parity size in an incremental redundancy system based on instantaneous bit error rate (BER) or symbol error rate (SER) estimation. System and methods are provided for estimating instantaneous BER/SER based on the Gaussian mixture-modeling of soft-decisions on the decoded bits or symbols. System and methods are provided for determining the initial code rate in an incremental system based on the Gaussian mixture modeling.

According to an embodiment of the disclosure, a method for transmitting data is provided. The method includes transmitting a first set of data encoded at a first data rate to a receiver, where the first block of data includes a first number of data bits and a first number of parity bits, receiving a first estimated number of bit errors for the first set of data from the receiver, determining a first instantaneous bit error rate for the first set of data based upon the estimated number of bit errors received from the receiver, determining a second data rate as a function of the first data rate and the first instantaneous BER, and transmitting a second block of data encoded at the second data rate to the receiver.

According to another embodiment of the disclosure, a receiver is provided. The receiver is configured to receive a first block of data encoded at a first data rate from a transmitter, where the first block of data includes a first number of data bits and a first number of parity bits, and to determine a first estimated number of bit errors for the first block of data from the receiver. The receiver is further configured to determine a first instantaneous bit error rate for the first set of data based upon the estimated number of bit errors in the first block of data, and to determine a second data rate as a function of the first data rate and the first instantaneous BER. The receiver is also configured to communicate a feedback message to the transmitter indicating that the transmitter should transmit subsequent blocks of data to the receiver using the second data rate, and to receive a second block of data from the transmitter encoded at the second data rate.

According to yet another embodiment of the disclosure, a system for data communication is provided. The system includes a receiver and a transmitter configured to transmit data to the receiver across a communication channel. The transmitter is further configured to transmit a first set of data encoded at a first data rate to the receiver, wherein the first set of data includes a first number of data bits and a first number of parity bits, to receive feedback data from the receiver indicative of channel conditions in response to transmitting the first set of data to receiver; and to transmit a second set of data encoded at a second data rate to the receiver, wherein the second data rate is determined based upon the feedback data received from the receiver. The receiver is configured to receive the first set of data encoded at the first data rate from the transmitter, to determine a first estimated number of bit errors for the first set of data, determine a first instantaneous bit error rate for the first set of data based upon the estimated number of bit errors in the first block of data, to determine a second data rate as a function of the first data rate and the first instantaneous, to transmit a feedback message to the transmitter requesting that the transmitter transmit subsequent blocks of data to the receiver using the second data rate, and to receive the second set of data from the transmitter encoded at the second data rate.

Other features and capabilities of the disclosed embodiments will be apparent in view of the following detailed description and figures.

DETAILED DESCRIPTION OF THE INVENTION

Embodiments according to the disclosure provide techniques for forward-error correction that overcome the limitations of conventional hybrid-ARQ techniques, such as those described above. System and methods are provided for decreasing the transmitted redundancy data when channel conditions improve and for increasing the transmitted redundancy data when channel conditions deteriorate.

Embodiments according to the disclosure provide bit-error-rate (BER) and symbol-error-rate (SER) estimation techniques and its application to incremental-redundancy and rate-adaptation for modern-coded hybrid-ARQ systems. BER/SER estimators based on iterative refinement of mixture-density modeling of the bit/symbol decision metrics are disclosed. Hybrid-ARQ system rate-adaptation functions are described that are based on BER/SER estimators for failed transmissions. Methods are disclosed for code-rate selection based on successfully decoded blocks as well as incremental parity size selection for retransmission of failed blocks. Techniques disclosed here may be applied to forward-error-correction codes employed for digital data communication systems.

Figure 1:
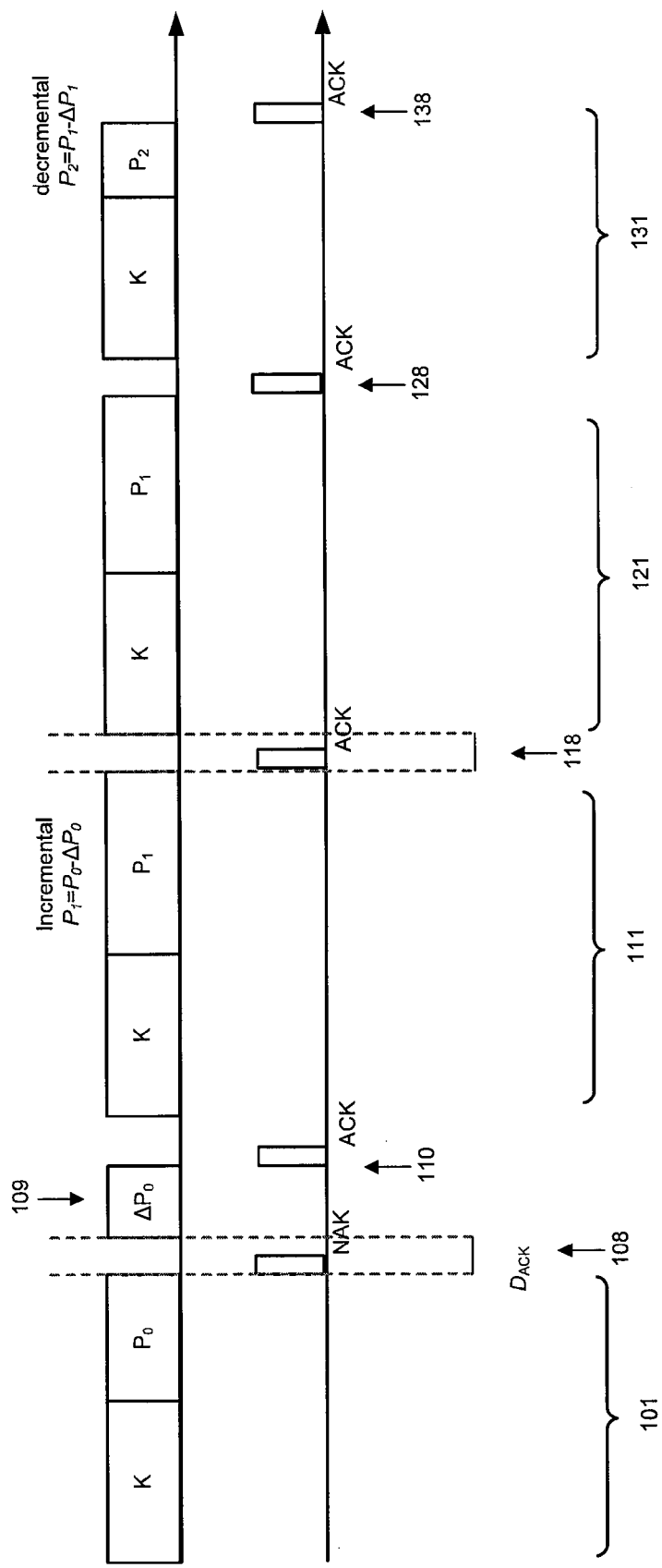
FIG. 1 is a block diagram illustrating the application of an incremental-decremental redundancy technique.

FIG. 1 illustrates communications between a transmitter and receiver using an incremental/decremental redundancy protocol according to an embodiment of the disclosure. The embodiment provided in FIG. 1 illustrates a code-rate increase (also referred to herein as "decremental redundancy") following an ACK indicating that the receiver successfully received and decoded a block of data from the transmitter, and also illustrates a parity request following a NAK indicating that the receiver was not able to successfully decode a block of data received from the transmitter due to errors. The FEC-based ARQ protocol illustrated in FIG. 1 maximizes the average throughput across a communication channel by varying the code-rate of the data based upon perceived channel conditions.

A code-rate increase may be implemented if the receiver is able to successfully decode a block of data transmitted, which indicates that the number of parity bits transmitted with each block of data may be able to be decreased for the current channel conditions. Decreasing the number of parity bits that are transmitted with each block of data allows more data to be transmitted over the channel, thereby increasing throughput across the channel while retaining the error-free nature of the transmission. Conversely, in the event that the receiver fails to decode a block of data and sends a NAK to the transmitter, the transmitter may send a set of additional parity bits to the receiver in response to the NAK that may enable the receiver to decode the block of data that the receiver failed to decode. The transmitter may also increase coding redundancy for subsequent blocks of data.

FIG. 1 illustrates a series of blocks of data (101, 111, 121, and 131) received by the receiver and corresponding acknowledgements (ACKs) (118, 128, and 138) or negative acknowledgements (NAKs) (108) sent to the transmitter by the receiver to indicate whether the block of data preceding the ACK or NAK was received and decoded without errors. Each block of data (101, 111, 121, and 131) includes K data bits and P parity bits. Block 101 includes a first number of parity bits $P_0$.

According to the embodiment illustrated in FIG. 1, the transmitter receives block 101, but the transmitter is unable to decode the data due to errors in the received block of data. In response to block 101, the transmitter transmits NAK 108 to the transmitter to indicate that errors occurred, and in response to receiving NAK 108, the transmitter transmits an additional set of parity bits 109 to the receiver. Upon receiving the additional set of parity bits 109, the receiver once again attempts to decode the block of data 102 using the additional parity bits 109 as well as the first number of parity bits $P_0$ that were transmitted as part of the block of data 101.

In the embodiment illustrated in FIG. 1, the receiver is able to successfully decode block of data 101 using the additional parity bits 109, and sends an ACK 110 to the transmitter indicating that the receiver was successfully able to decode block of data 101 using the additional parity bits 109. In response, the transmitter increases the number of parity bits transmitted with subsequent blocks of data.

The transmitter transmits the next block of data (block 111) which includes $P_1$ parity bits, where $P_1$ equals the number of parity bits from the first block ($P_0$) plus the number of parity bits that were included in the additional parity bits 109. The receiver receives block 111, successfully decodes the block of data without errors, and transmits ACK 120 to the transmitter.

The transmitter then transmits block of data 121 with $P_1$ parity bits. The receiver receives and decodes block 121 and sends ACK 130 to the transmitter. In response to ACK 130, the transmitter adjusts the encoding rate. The receiver has received the last two blocks of data without error, which may have been due to improved channel conditions or due to the increased redundancy introduced by increasing the number of parity bits transmitted with each block of data. The transmitter decreases redundancy of the next block of data by reducing the number of parity bits to P2, where P2 is equal to the previous number of parity bits P1 included with each block of data minus decremented by a delta P1. Delta P1 is determined based upon current channel conditions with the resulting P2 value intended to reduce redundancy and to maximize the amount of data that can be transmitted across the channel.

FIG. 1 merely illustrates embodiment of the techniques for improving data throughput disclosed herein. One skilled in the art will recognize that many variation of the Additional embodiments described below illustrate techniques for determining the number of parity bits to be included in each block of data in response to changing channel conditions.

Various techniques for incremental/decremental redundancy are described in detail below. These techniques include:

(1) techniques for incremental-redundancy using an estimate of the instantaneous bit-error-rate/symbol-error-rate (instantaneous BER/SER), described in Section 2.1.

(2) techniques for estimating the instantaneous-BER using channel observations and/or the bit decision metrics using an FEC decoder, described in Section 2.2.

Figure 2:
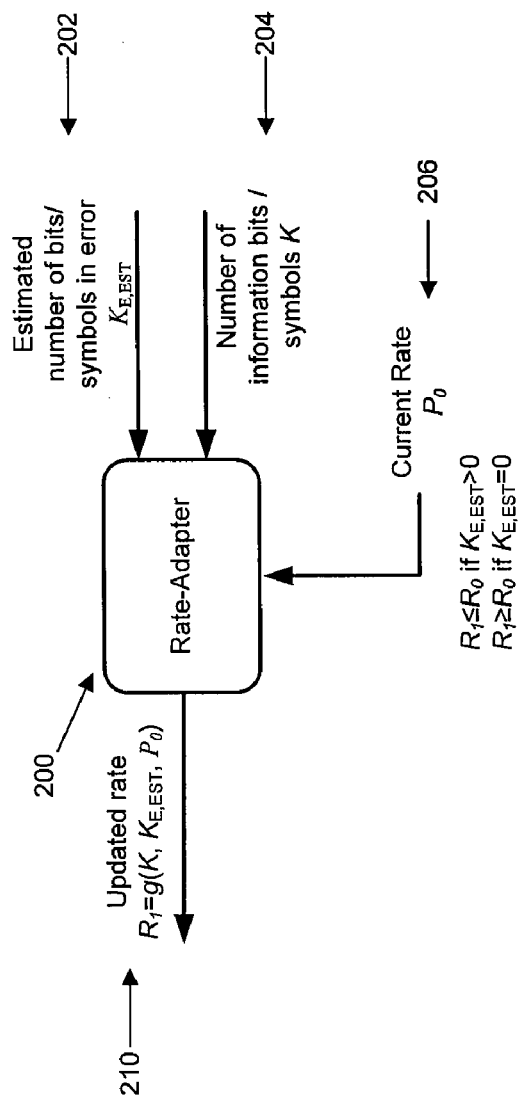
FIG. 2 is a block diagram illustrating a rate-adapter.
Figure 3:
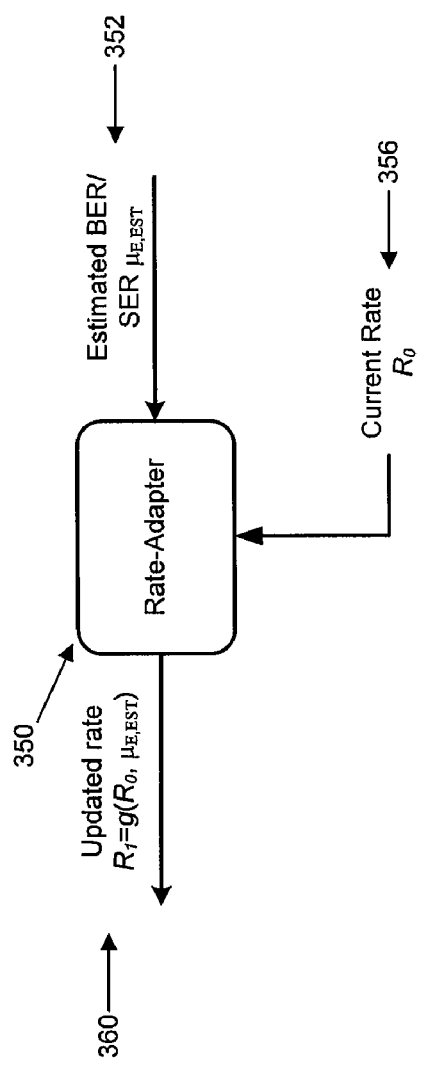
FIG. 3 is a block diagram illustrating another rate-adapter.
Figure 4:
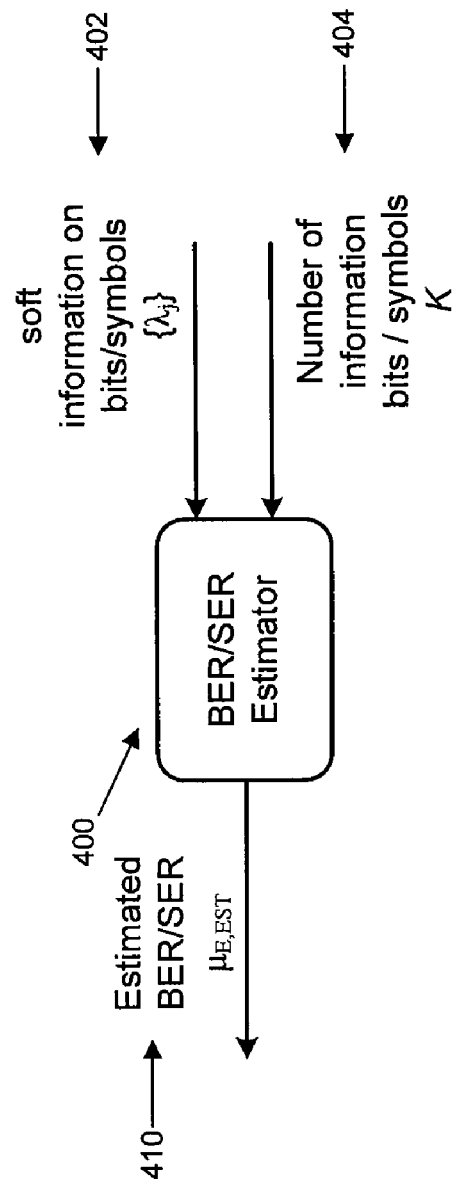
FIG. 4 is a block diagram illustrating a BER/SER estimator.
Figure 5:
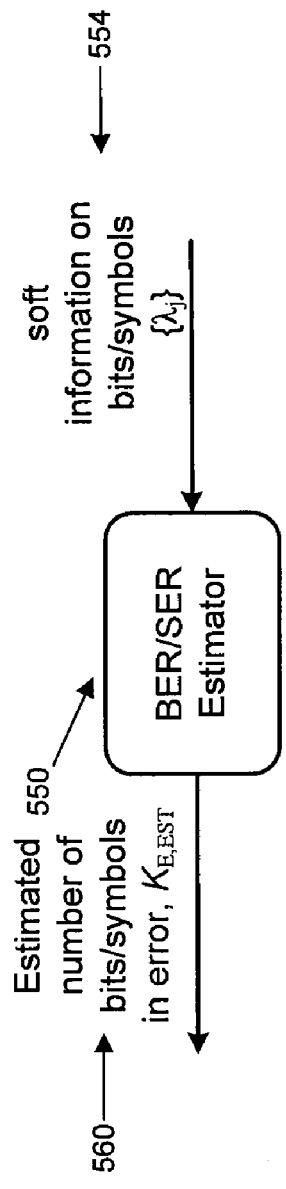
FIG. 5 is a block diagram illustrating a BER/SER estimator.

FIGS. 2-5 provide exemplary implementations of these techniques according to embodiments of the disclosure. FIGS. 2 and 3 are block diagrams of illustrating two implementations of rate-adaptors according to embodiments of the disclosure, and FIGS. 4 and 5 are block diagrams illustrating two implementations of BER/SER estimators according to embodiments of the disclosure. The rate-adaptors illustrated in FIGS. 2 and 3 and the BER/SER estimators illustrated in FIGS. 4 and 5 may be used in the implementation a communication system using incremental/redundancy, such as that illustrated in FIG. 6.

Based on the two techniques describe above, an incremental/decremental redundancy scheme is provided, which constitutes:

(3) Techniques for incremental/decremental redundancy implemented using the BER/SER estimation of (2), described in Section 2.3.

Some embodiments of the disclosure may also include an error-detection encoder preceding the FEC encoder. The error detection encoder appends to the set of information symbols $\{b_m\}$ a set of check symbols $\{a_m\}$ computed as a function of $\{b_m\}$. According to a preferred embodiment, the number of error-detection symbols $\{a_m\}$ is much smaller than the number of information symbols, so that the number of error-detection symbols can be ignored in rate-adaptation computation. The presence of the error detection symbols, however, is accounted for in the throughput computations of Section 2.4.

The techniques described herein apply to any binary FEC decoder that delivers data bit estimates by thresholding bit-decision variables as in equation (1.1.2), or to any non-binary FEC decoder that computes likelihoods or probabilities for information symbols as in equation (1.1.4). Moreover, no specific assumptions are made as to the nature of the communication channel.

FIG. 2 is a block diagram of a rate-adaptor according to an embodiment of the disclosure. Rate-adaptor 200 illustrates another embodiment of a rate-adaptor that is configured to determine an updated rate using different techniques than rate-adaptor 250. Rate-adaptor 200 is configured to output updated rate 210 based upon current rate 206, the number of information bits/symbols K, and estimated number of bits/symbols in error $K_{E,EST}$ and estimated error rate 252. Updated rate 210 may be determined using the techniques described herein. Embodiments of rate-adaptor 200 may be implemented as hardware, software, or a combination thereof.

FIG. 3 is a block diagram of another rate-adaptor according to an embodiment of the disclosure. Rate-adaptor 350 is configured to output updated rate 360 based upon current rate 356 and estimated error rate 352. Estimated error rate 352 is the estimated bit error rate (BER) for binary codes and the estimated symbol error rate (SER) for non-binary codes. Updated rate 360 is may be determined using the techniques described herein. Embodiments of rate-adaptor 350 may be implemented as hardware, software, or a combination thereof.

FIG. 4 is a block diagram of a BER/SER estimator according to an embodiment of the disclosure. BER/SER estimator 400 illustrates another embodiment of a BER/SER estimator that is configured to determine the using different techniques than BER/SER estimator 450. BER/SER estimator 400 is configured to output an estimated number of bits/symbols in error 410 based upon soft information on bits/symbols ($\lambda_j$) 402, and the number of information bits/symbols K 404. Estimated BER/SER 410 may be determined using the techniques described herein for determining BER/SER estimates. Embodiments of BER/SER estimator 400 may be implemented as hardware, software, or a combination thereof.

FIG. 5 is a block diagram of another BER/SER estimator according to a embodiment of the disclosure. BER/SER estimator 550 is configured to output an estimated number of bits/symbols in error 560 based upon soft information on bits/symbols ($\lambda_j$) 554. Estimated number of bits/symbols in error 560 is may be determined using the techniques described herein for computing BER/SER estimates. Embodiments of BER/SER estimator 550 may be implemented as hardware, software, or a combination thereof.

Figure 6:
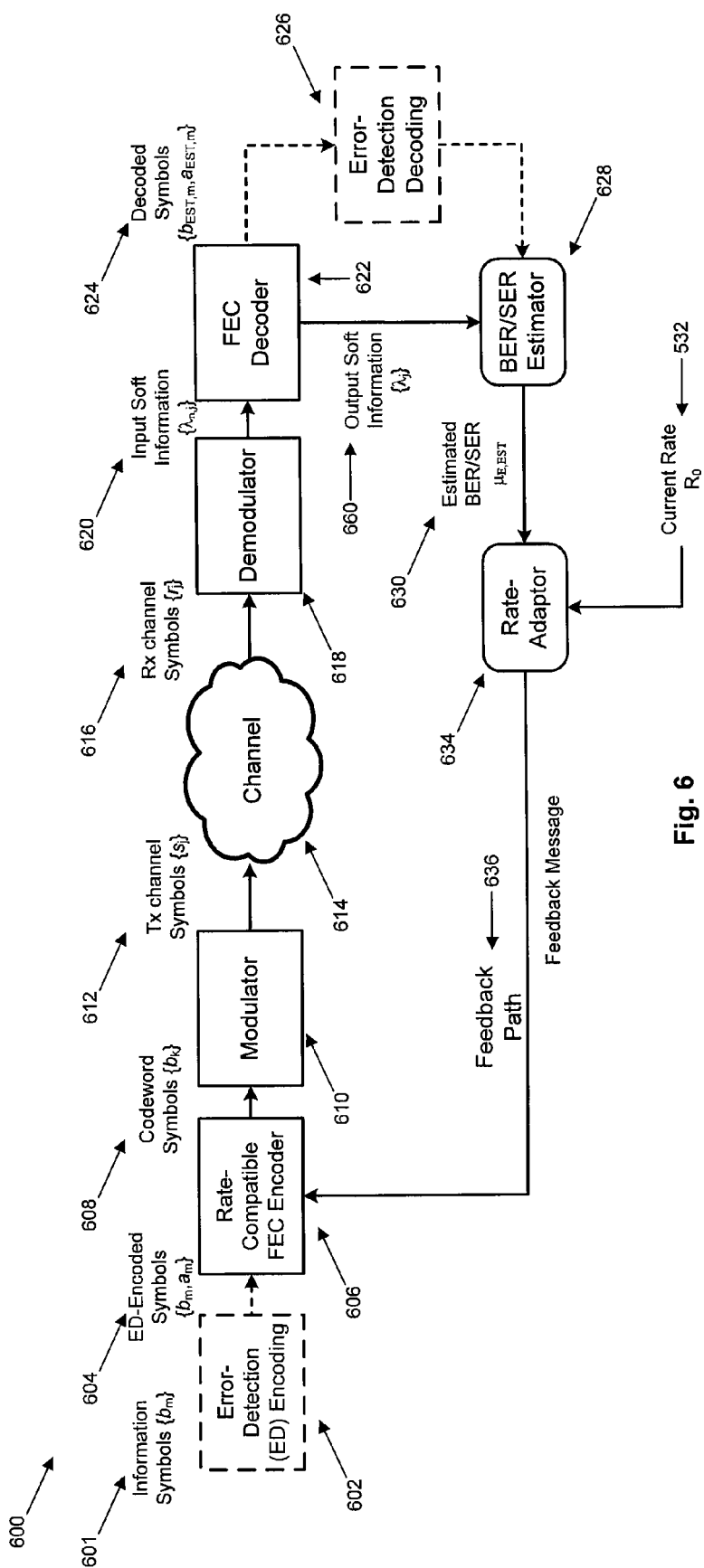
FIG. 6 is a block diagram a communication system implementing incremental-decremental redundancy with rate-adaptation based on BER/SER estimation.

FIG. 6 is a block diagram of a communication system 600 using incremental/decremental redundancy according to an embodiment of the disclosure. Communication 600 represents both the transmitter and the receiver components of a communication system and the interaction between these components. The transmitter (not shown) is configured to transmit data to the receiver via communication channel 614. The transmitter (not shown) comprises rate-compatible FEC encoder 606, a modulator 610, and an optional error-detection (ED) encoder 602. The receiver (now shown) includes demodulator 618, FEC decoder 622, an optional error-detection (ED) decoder 626, BER/SER Estimator 628, and Rate- Adaptor 634. Rate-Adaptor 634 is linked to the rate-compatible FEC encoder 606 via feedback path 636. Feedback path 636 may be same as communication channel 614, a different communication channel, or an alternate communication medium that enables data to be communicated from rate-adaptor 634 to rate-compatible FEC encoder 606.

Optional ED encoder 602 receives information symbols 601 representing the contents of a message to be transmitted to the receiver. ED encoder 602 encodes information symbols 601 and outputs ED-encoded symbols 604 which are then input to rate-compatible FEC encoder 606. In embodiments where ED encoder 602 is omitted, information symbols 601 are input directly to rate-compatible FEC encoder 606.

Rate-compatible FEC encoder 606 FEC encoder receives data to be encoded, and outputs a set of codeword symbols 608 that are input into modulator 610. Encoding the data adds redundancy in the form of parity bits that assist FEC decoder 622 on the receiver side to recover from some errors introduced during transmission, such as due to adverse channel conditions. Rate-compatible FEC encoder 606 also receives feedback messages from rate-adaptor 634 via feedback path 636. Rate-compatible FEC encoder 606 adjusts the rate according to the feedback messages received from rate-adaptor 634. Rate-adaptor 634 may send a message to rate-compatible FEC encoder 606 suggesting that rate-compatible FEC encoder 606 use a rate having higher redundancy in the event that a higher BER/SER estimated is computed by BER/SER estimator 628 or a rate having a lower redundancy in the event that a lower BER/SER estimate is computed by BER/SER estimator 628.

Rate-compatible FEC encoder 606 may also generate a set of additional parity bits in response to a NAK. If an error is detected while decoding a block of data received from the transmitter, the rate-adaptor may send a message to the to FEC encoder across feedback path 636 that request additional parity bits to be transmitted. Alternatively, according to some embodiments, rate-compatible FEC encoder 606 may resend and entire block of data in response to a NAK.

Modulator 610 receives codeword symbols 608 from rate-compatible FEC encoder 606 and modulates the codeword symbols 608 for transmission over channel 614. Modulator 610 outputs transmit symbols 612. The modulated transmit symbols 612 are transmitted to the receiver via channel 614.

Demodulator 616 receives as input received symbols 616 that represent the symbols received by the transmitter over channel 614. Demodulator 616 demodulates the received symbols 616 and outputs input soft information 620 to FEC decoder 622. FEC decoder 622 outputs decoded symbols 624 to ED Decoder 626 in embodiments where the transmitted data is ED encoded prior to transmission. ED Decoder 626 decodes the symbols output by FEC decoder 622 and provides the decoded symbols to BER/SER estimator 628. Alternatively, in embodiments where the transmitted data is not ED encoded, FEC decoder 622 outputs output soft information 660 to BER/SER estimator 628.

BER/SER estimator 628 estimated the bit error rate if a binary code is being used or the symbol error rate for non-binary codes. The BER/SER estimator may estimate the bit error rate or the symbol error rate using any of the various techniques disclosed herein. According to some embodiments, BER/SER estimator 628 may be implemented similarly to BER/SER estimator 400 illustrated in FIG. 4 or to BER/SER estimator 550 illustrated in FIG. 5. BER/SER estimator outputs instantaneous estimated BER/SER 630 which is input to rate-adaptor 634.

Rate-adaptor 634 receives instantaneous estimated BER/SER 630 from BER/SER estimator 628 and current code rate 632. Rate-adaptor 634 computes a new code rate for subsequent block of data based upon instantaneous estimated BER/SER 630 and current code rate 632 and outputs a feedback message to rate-compatible FEC encoder 606 via feedback path 636. Rate-adaptor 634 may compute the new rate using any of the various techniques disclosed here. According to some embodiments, rate-adaptor 634 may be implemented similarly to rate-adaptor 200 illustrated in FIG. 2 or rate-adaptor 350 illustrated in FIG. 3. According to some embodiments, rate-adaptor 634 may also send a message to rate-adaptor FEC encoder 606 requesting additional parity bits so that FEC decoder 620 may attempt to decode a received block of data that previously failed due to errors.

One skilled in the art will recognize that in some embodiments, some components, such as the BER/SER estimator 434 and/or the rate-adaptor 434 may be integrated into the transmitter or another device external to both the receiver and the transmitter that is in communication with both the transmitter and the receiver.

2.1. Determining Incremental-Redundancy Using an Estimate of the Instantaneous BER/SER According to embodiments of the disclosure, techniques are provide for determining incremental-redundancy using an estimate of the instantaneous BER/SER. The amount of redundancy (i.e. the number of parity bits transmitted with each block of data) is increased based upon the bit error rate for embodiments using binary FEC and based upon the symbol error rate for embodiments using non-binary FEC. Techniques for binary FEC codes are addressed first in this section, followed by techniques for non-binary FEC codes.

Consider a rate-compatible binary FEC code family which can encode a block of K data bits using P parity bits, where P can take the values $\{P_i, 0 < P_i \leq P_{max}\}$ as described in Section 1.2, where the full-set of $P_{max}$ parity bits (corresponding to a smallest code-rate of $R_{min} = K/(K+P_{max})$) is punctured to achieve higher code-rates. Consider a particular transmission in which a K-bit block is encoded using $P_0$ parity bits so that the code-rate is:

$$R_0 = \frac{K}{K + P_0} \quad (2.1.1)$$

Let $K_{E,EST}$ denote an estimate of the number of bit errors in the K-bit message after decoding. Equivalently, one could consider the instantaneous BER estimate, $$\mu_{E,EST} = \frac{K_{E,EST}}{K} \quad (2.1.2)$$

At this point we do not make any assumptions as to how this estimate may have been obtained. Techniques for computing such estimates are disclosed in Section 2.2.

The rate-adapter computes a new code-rate $R_1$ as a function of the current code-rate $R_0$ and the instantaneous-BER estimate $\mu_{E,EST}$. Equivalently, the rate-adapter computes R1 as a function of the block size K, the current number of parity bits $P_0$, and the estimated number of bit errors in the current block, $K_{E,EST}$:

$$R_1 = h(K, P_0, K_{E,EST}) = g(R_0, \mu_{E,EST}) \quad (2.1.3)$$

In one embodiment of the rate-adapter, a new code-rate $R_1$ is computed as $$R_1 = \frac{K - K_{E,EST}}{K - K_{E,EST} + P_0} = \frac{R_0(1 - \mu_{E,EST})}{1 - R_0\mu_{E,EST}} \quad (2.1.4a)$$

In another embodiment of the rate-adapter, a new code-rate $R_1$ is computed as $$R_1 = \frac{K - K_{E,EST}}{K + P_0} = R_0(1 - \mu_{E,EST}) \quad (2.1.4b)$$

which proposes a lower code-rate than (2.1.4a) for the same BER estimate. For the next block of data, the transmit-side encoder may then choose to switch to rate $R_1$.

With either embodiment, if the BER estimate is zero, the new code-rate is the same as the current rate, $R_1 = R_0$.

If the estimated BER is too high, the value of the new code-rate $R_1$ may be lower than $R_{min}$ or even be negative. Various embodiments of the disclosure may be configured to take appropriate action in the even that $R_1$ is lower than $R_{min}$ or is negative. For example, according to an embodiment, if $R_1$ falls below a predetermined threshold, such as $R_{min}$, the transmitter may resend the entire block of data with the smallest coding rate. According to other embodiments, the transmitter may temporarily hold off transmitting until the transmitter receives indication that the channel conditions have improved. One skilled in the art will recognize that other configurations may also be possible, such as resending the entire block of data with the smallest coding rate if $R_1$ falls below a first threshold and holding off transmission until channel conditions improve if $R_1$ is lower than a second threshold.

If $R_1 \geq R_{min}$, the FEC encoder is prompted to send an additional set of $\Delta P$ parity bits such that the original $P_0$ parity bits and the requested $\Delta P$ parity bits would combine to yield a code-rate (approximately) equal to $R_1$. Based on the original rate adapter rate equation (2.1.4a), the number of extra parity bits requested is given by $$\Delta P = \frac{\mu_{E,EST}}{1 - \mu_{E,EST}} P_0, \; R \geq R_{min} \quad (2.1.5a)$$

If the rate-adapter of (2.1.2b) is used, the number of extra parity bits requested is given by $$\Delta P = \frac{\mu_{E,EST}}{1 - \mu_{E,EST}} (P_0 + K), \; R \geq R_{min} \quad (2.1.5b)$$

Generalization to Non-binary Codes:

The rate-updater equations (2.1.4a) and (2.1.4b) can be extended to the case of systematic non-binary FEC codes if an estimate $\mu_{E,EST}$ of the symbol-error-rate (SER) is available. As in Section 1.1, let $|F_b|$ be the size of the encoder input alphabet and $|F_c|$ be the size of the encoder output alphabet and $M = \log|F_c|/\log|F_b| \geq 1$. The rate update of (2.1.2a) generalizes to $$R_1 = \frac{R_0(1 - \mu_{E,EST})}{R_0(1 - \mu_{E,EST}) + M(1 - R_0)} \quad (2.1.6a)$$

and that of (2.1.2b) becomes $$R_1 = \frac{R_0(1 - \mu_{E,EST})}{M - R_0(M - 1)} \quad (2.1.6b)$$

The update calculations (2.1.6a) and (2.1.6b) are independent of how the instantaneous-BER/SER estimates have been obtained.

In the next section, techniques for instantaneous-BER estimation are provided that may be used in conjunction with the techniques for incremental-redundancy determination described above.

2.2. Estimating Instantaneous BER/SER Based on Mixture Density Model for Bit/Symbol-Decision Variables According to an embodiment of the disclosure, techniques for estimating the instantaneous bit error rate for binary codes and symbol error rate for non-binary codes are provided. All systematic binary turbo-like (i.e. modern) codes threshold the bit-decision metrics (or bit-decision variables) to deliver final bit-decisions. As discussed in Section 1.1, any bit-decision metric based on a posteriori probabilities can be converted to a log-likelihood-ratio (LLR), i.e. the logarithm of the ratio of the probability that the bit is a '0' to the probability that the bit is a '1', as computed by the decoder. For this reason, we assume bit-decision variables are a posteriori LLR quantities.

Let $\lambda_k$ denote the bit-decision metric for input bit $b_k$, as defined by equation (1.1.2). The bit-decision, $b_{EST,k}$ is obtained by comparing the final decision metric $\lambda_k$, to zero: If $\lambda_k$ is greater than or equal to zero ($\lambda_k$ non-negative), the bit-decision is a '0', i.e. $b_{EST,k} = 0$, otherwise ($\lambda_k$ negative), $b_{EST,k} = 1$.

The bit-decision metrics $\{\lambda_k\}$ are modeled as independent and identically distributed random variables having a mixture-Gaussian probability distribution. The probability density function of $\{\lambda_k\}$ is therefore approximated by $$f_\Lambda(\lambda) = p_0 \frac{1}{\sqrt{2\pi} \; \sigma_0} \exp\left(-\frac{(\lambda - m_0)^2}{2\sigma_0^2}\right) + p_1 \frac{1}{\sqrt{2\pi} \; \sigma_1} \exp\left(-\frac{(\lambda - m_1)^2}{2\sigma_1^2}\right) \quad (2.2.2)$$

where $p_0$ corresponds to the fraction of '0' bits in the input message, $m_0$ is the mean decision metric for '0' bits ($m_0 > 0$), and $\sigma_0$ is the standard deviation of the decision metrics for '0' bits. Similarly, $p_1$ corresponds to the fraction of bits that are '1' in the input message ($p_1 = 1 - p_0$), $m_1$ is the mean decision metric for '1' bits ($m_1 < 0$), and $\sigma_1$ is the standard deviation of the decision metrics for '1' bits.

For a particular block of decoded data, define the output-SNR $\gamma_0$ for '0' bits, and output-SNR $\gamma_1$ for '1' bits as in equation (2.2.3)

$$\gamma_0 = \frac{m_0^2}{\sigma_0^2}, \qquad \gamma_1 = \frac{m_1^2}{\sigma_1^2} \quad (2.2.3)$$

The quantities $\gamma_0$ and $\gamma_1$ can be estimated using the K decision metrics $\lambda_k$, k=1, 2, ... K. The pair $(\gamma_0, \gamma_1)$ is referred to as simply output-SNR.

We denote the estimate of $\gamma_0$ by $\gamma_{0,EST}$, and the estimate of $\gamma_1$ by $\gamma_{1,EST}$. Also let $p_{0,EST}$ denote the estimated fraction of '0' bits, and $p_{1,EST} = 1 - p_{0,EST}$ denote the estimated fraction of '1' bits. The pair $(\gamma_{0,EST}, \gamma_{1,EST})$ is referred to as simply output-SNR estimate. Based on the output-SNR estimate, we define an instantaneous BER estimate as $$\mu_{E,EST} = p_{0,EST} Q(\sqrt{\gamma_{0,EST}}) + p_{1,EST} Q(\sqrt{\gamma_{1,EST}}) \quad (2.2.4)$$

where $$Q(x) = \frac{1}{\sqrt{2\pi}} \int_{t=x}^{\infty} \exp(-x^2/2) dt \quad (2.2.5)$$

is the standard Gaussian tail integral function. The Q-function of (2.4) could be computed using an approximate close-form expression or by table look-up. Techniques for computing $\gamma_{i,EST}$ and $p_{i,EST}$ are described in Section 2.2.1.

The estimate of the number of bit errors in the block based on the instantaneous bit error estimate of equation (2.2.4) is given by $$K_{E,EST} = \text{ceil}(K \cdot \mu_{E,EST}) \quad (2.2.6)$$

where ceil(x) is the smallest integer greater than or equal to x. Equation (2.2.6) indicates that we estimate the block to be error-free if $\mu_{E,EST} < 1/K$ where $\mu_{E,EST}$ is given by equation (2.2.4) and K is the message length.

Generalization to Non-Binary Codes:

For non-binary codes in which the input symbol alphabet is non-binary, the mixture Gaussian model of equation (2.2.2a) and equation (2.2.2b) could still be applied if $\{\lambda_k\}$ is redefined as a modified LLR on the input alphabet. In this case, $K_{E,EST}$ represents the number of symbol errors and $\mu_{E,EST}$ represents the symbol error rate (SER).

In one embodiment of the modified-LLR computation, the log-ratio of the probability of the most-likely symbol $b_{EST,k}$ (upon decoding) in the alphabet to the sum of the probabilities of the rest of the symbols is computed:

$$\lambda_k \approx \log \frac{p(b_k = b_{EST,k} \mid \{\lambda_{in,n}, n = 1, \ldots, N\})}{\sum_{b \in F_b, b \neq b_{EST,k}} p(b_k = b \mid \{\lambda_{in,n}, n = 1, \ldots, N\})} \quad (2.2.7a)$$

In another embodiment of the modified-LLR computation, the log-ratio of the probability the most-likely symbol (upon decoding) in the alphabet to the second most-likely symbol (upon decoding) is computed:

$$\lambda_k \approx \log \frac{p(b_k = b_{EST,k} \mid \{\lambda_{in,n}, n = 1, \ldots, N\})}{\max_{b \in F_b, b \neq b_{EST,k}} p(b_k = b \mid \{\lambda_{in,n}, n = 1, \ldots, N\})} \quad (2.2.7b)$$

The distribution of the modified-LLRs could still be modeled using a mixture-Gaussian probability density function as in equation (2.2.2a), in which $p_0$ is the fraction of input symbols for which $\lambda_k \geq 0$, and $p_1$ is the fraction of input symbols for which $\lambda_k < 0$. If the modified-LLR computation of equation (2.2.7b) is used, then $p_1 = 0$.

2.2.1 Developing an Estimator for the Output-SNR based on Bit-Decision/Symbol-Decision Variables There are several techniques that can be used to develop an estimator for the output-SNR based on the bit-decision variables (or symbol decision variables) $\{\lambda_k, k=1, \ldots, K\}$. We disclose two embodiments of output-SNR estimators based on the mixture density model for the decision variables $\{\lambda_k\}$.

In one embodiment of the output-SNR estimator (coarse output-SNR estimator), coarse estimates for the mixture probability, means and the standard deviations of the mixture distribution are computed as $$p_{0,EST}^{coarse} = \frac{K_0}{K}, \; p_{1,EST}^{coarse} = \frac{K_1}{K} = 1 - p_{0,EST}^{coarse} \quad (2.2.8a)$$

$$m_{0,EST}^{coarse} = \frac{1}{K_0} \sum_{j:\lambda_j \geq 0} \lambda_j, \; m_{1,EST}^{coarse} = \frac{1}{K_1} \sum_{j:\lambda_j < 0} \lambda_j \quad (2.2.8b)$$

$$\sigma_{0,EST}^{coarse} = \sqrt{\frac{1}{K_0} \sum_{j:\lambda_j \geq 0} (\lambda_j - m_{0,EST}^{coarse})^2}, \quad (2.2.8c)$$

$$\sigma_{1,EST}^{coarse} = \sqrt{\frac{1}{K_1} \sum_{j:\lambda_j < 0} (\lambda_1 - m_{1,EST}^{coarse})^2}$$

where $K_0 = |\{\lambda_k : \lambda_k \geq 0, k=1, \ldots, K\}|$ is the number of bit-decisions that are '0', and $K_1 = K - K_0$ is the number of bit-decision that are '1'. The coarse estimates in (2.2.8a) yield a coarse estimate for the output-SNR as $$\gamma_{0,EST}^{coarse} = \left(\frac{m_{0,EST}^{coarse}}{\sigma_{0,EST}^{coarse}}\right)^2, \; \gamma_{1,EST}^{coarse} = \left(\frac{m_{1,EST}^{coarse}}{\sigma_{1,EST}^{coarse}}\right)^2 \quad (2.2.8d)$$

Parameter estimates in equations (2.2.8a-d) can be used in equation (2.2.4) to deliver coarse BER estimates.

In another embodiment of the output-SNR estimator (fine output-SNR estimator), estimates of the mean m and the standard deviation σ are obtained iteratively using the expectation-maximization algorithm, in which the estimates of the mean, standard deviation and the mixture probability are updated at every iteration. Let $p_{0,EST}(i)$ denote the estimate of the mixture probability $p_0$, $m_{0,EST}(i)$, $m_{1,EST}(i)$ denote the estimate of the mean parameters and $\sigma_{0,EST}(i)$, $\sigma_{1,EST}(i)$ denote the estimate of the standard deviation parameters at iteration i. The iterations could be initialized using the coarse estimates of equation (2.2.8a-d) as follows:

$$p_{j,EST}(0) = p_{j,EST}^{coarse}, \quad (2.2.9)$$

$$m_{j,EST}(0) = m_{j,EST}^{coarse},$$

$$\sigma_{j,EST}^2(0) = (\sigma_{j,EST}^{coarse})^2, \; j = 0,1$$

At iteration i+1, (i=0, 1 . . . ), first an estimate $q_k(i+1)$ of the probability that the kth bit is a '0' is computed based on the available mean and standard deviation estimates as well as the estimate of the mixture probability obtained in iteration i. Similarly, $\bar{q}_k(i+1)$ will denote the probability that the kth bit is a '1' based on available parameter estimates:

$$q_k(i+1) = \frac{1}{1 + \frac{1 - p_{0,EST}(i)}{p_{0,EST}(i)} \exp\left(-\frac{2\lambda_k m_{EST}(i)}{\sigma_{EST}^2(i)}\right)}, \quad (2.2.10a)$$

$$\bar{q}_k(i+1) = 1 - q_k(i+1)$$

The estimates of the mean, standard deviation and the mixture probability are then updated as follows:

$$m_{0,EST}(i+1) = \frac{\sum_{k=1}^{K} q_k(i+1) \lambda_k}{\sum_{k=1}^{K} q_k(i+1)}, \quad (2.2.10b)$$

$$m_{1,EST}(i+1) = \frac{\sum_{k=1}^{K} \bar{q}_k(i+1) \lambda_k}{\sum_{k=1}^{K} \bar{q}_k(i+1)}$$

-continued $$\sigma_{0,EST}^2(i+1) = \frac{\sum_{k=1}^{K} q_k(i+1)(\lambda_k - m_{0,EST}(i+1))^2}{\sum_{k=1}^{K} q_k(i+1)} \quad (2.2.10c)$$

$$\sigma_{1,EST}^2(i+1) = \frac{\sum_{k=1}^{K} \bar{q}_k(i+1)(\lambda_k - m_{1,EST}(i+1))^2}{\sum_{k=1}^{K} \bar{q}_k(i+1)}$$

$$p_{0,EST}(i+1) = \frac{1}{K}\sum_{k=1}^{K} q_k(i+1), \quad (2.2.10d)$$

$$p_{1,EST}(i+1) = 1 - p_{0,EST}(i+1)$$

The fine estimates for the mean and the standard deviation converge within a few iterations for most cases. The resulting fine estimate of the output-SNR of the decoder after iteration I is defined similarly to equation (2.2.8d)

$$\gamma_{0,EST}^{fine} = \frac{m_{0,EST}^2(I)}{\sigma_{0,EST}^2(I)}, \quad (2.2.10e)$$

$$\gamma_{1,EST}^{fine} = \frac{m_{0,EST}^2(I)}{\sigma_{0,EST}^2(I)}$$

Parameter estimates in equations (2.2.10b-d) can be used in equation (2.2.4) to deliver fine BER estimates.

In another embodiment of the output-SNR estimator (output-SNR estimator with symmetry condition), computation is further simplified using the symmetry condition which states that the variance $\sigma_j^2$ and the mean $m_j$ parameters satisfy $$\sigma_j^2 2m_j, j=0,1 \quad (2.2.11)$$

The symmetry condition has been shown to be approximately valid in a number of scenarios. When the symmetry condition holds, the output-SNR can be estimated by using the mean estimate only:

$$\gamma_{j,EST}^{symmetric} = \sqrt{\frac{m_{j,EST}}{2}}, j = 0,1 \quad (2.2.12)$$

where $m_{j,EST}$ can be obtained using (2.2.8b).

Apart from its aforementioned use in incremental-redundancy (Section 2.1), BER/SER estimation based on output-SNR estimation enables a decremental-redundancy scheme in which a higher code-rate (lower redundancy) may be proposed if the error-detection circuit (or the BER estimator, if there is no error-detection) indicates successful decoding. In the incremental-only-redundancy scheme, a potential decrease in redundancy (increased code-rate) is not readily available following a successfully decoded block.

An embodiment of incremental/decremental redundancy using BER/SER estimation (Section 2.1) based on output-SNR estimation (Section 2.2) is disclosed next in Section 2.3.

2.3. Determining Incremental-Redundancy Based on an Estimate of the Instantaneous Bit Error Rate/Symbol Error Rate using a Gaussian Mixture Density Model An incremental redundancy scheme using instantaneous BER/SER estimates based on (2.2.2b) was described in Section 2.1. In this scheme, if the BER/SER estimator (or the error-detection decoder, or both) indicated a presence of errors, a rate-adapter was used to compute a new code rate to retransmit the data. If the system was employing a rate-compatible systematic code family, based on the current code-rate and the computed new code-rate, an additional set of parity bits/symbols is requested from the transmit-side.

According to a preferred embodiment of the incremental/decremental redundancy method illustrated in FIG. 4, the instantaneous BER/SER estimator is based on the output-SNR computation (Section 2.2.1), and redundancy is incremented using the rate adapter of (2.1.4.b), when the BER/SER estimator indicates the presence of errors. In this case, a new and possibly lower code-rate is computed as $$R_1 = \max\left\{\frac{R_0(1 - \mu_{E,EST})}{M - R_0(M-1)}, R_{min}\right\} \quad (2.3.1a)$$

where $M=\log(|F_c|)/\log(|F_b|)$ for non-binary codes, and $M=1$ for binary codes and $R_{min}$ is the smallest rate that the FEC encoder uses.

In the preferred embodiment of the incremental/decremental redundancy method, when the BER/SER estimator (or the error-detection decoding, or both) indicates no errors, the estimate for the output-SNR can be used to decrease the redundancy (increase the code-rate) for the next transmission. In this case, the rate-adapter computes a (possibly) higher rate based on $$R_1 = \max\left\{R \geq R_0 : K\left(p_{0,EST}Q\left(\sqrt{10^{-(R-R_0)}\gamma_{0,EST}}\right) + p_{1,EST}Q\left(\sqrt{10^{-(R-R_0)}\gamma_{1,EST}}\right)\right) < 1\right\} \quad (2.3.1b)$$

where the Q function is defined in (2.2.5) and $R_0$ is the original code-rate.

2.4. Numerical Results

Figure 7:
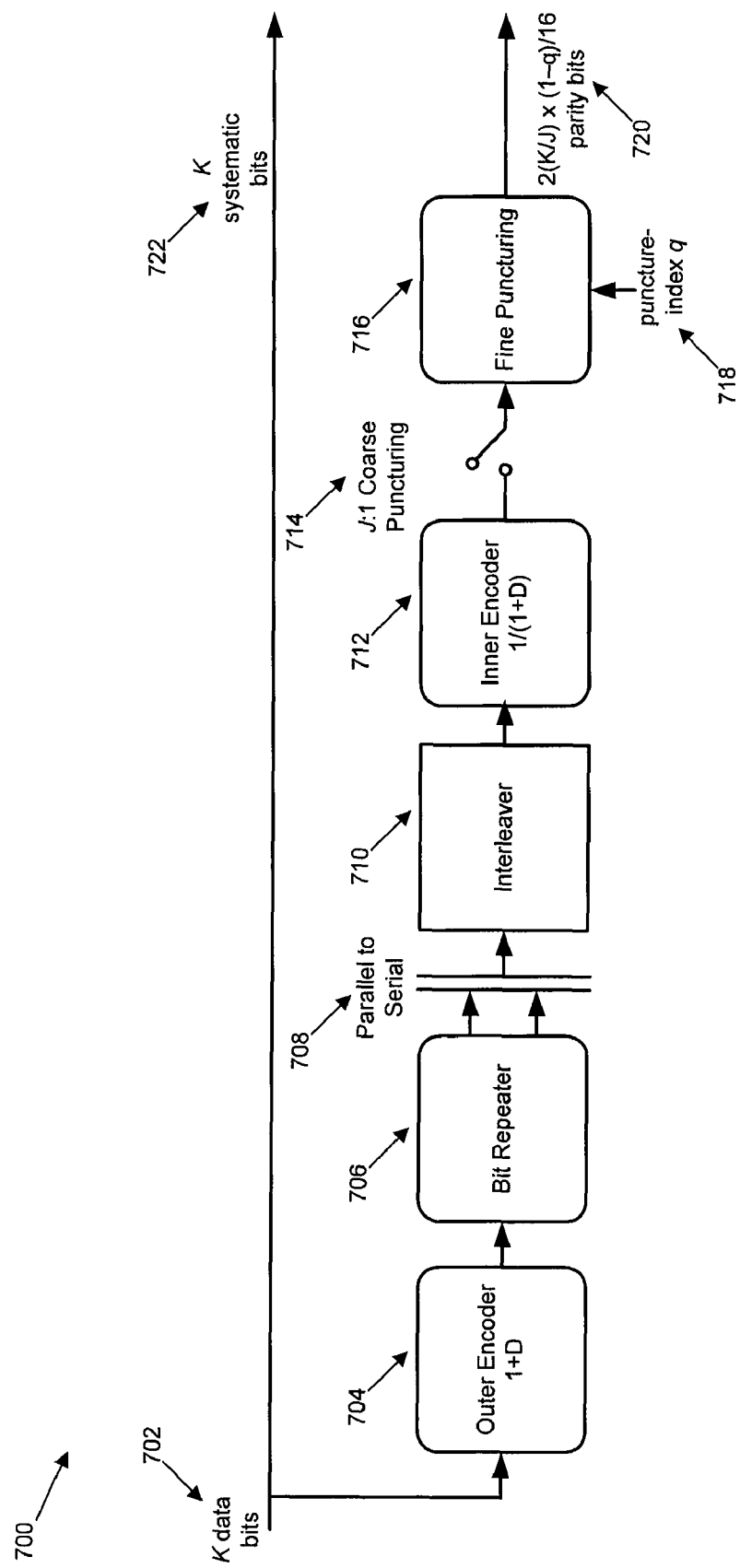
FIG. 7 is a block diagram of a F-LDPC Encoder.

The incremental/decremental redundancy scheme has been tested using the F-LDPC code of TrellisWare Technologies. FIG. 7 is a block diagram of an encoder 700 for the F-LDPC. Encoder 700 receives K data bits 702 to be encoded. The K data bits are input to outer encoder 704 and the encoded output from outer encoder 704 is input into bit repeater 706. The outputs from bit repeater 706 are then converted from parallel outputs to a single serial output by parallel to serial converter 708. The output from parallel to serial converter 708 is then input to interleaver 710. The interleaved output from interleaver 710 is then input to inner encoder 712. The encoded output from inner encoder 712 is then coarse punctured at coarse puncturing module 714. The coarse punctured output from coarse puncturing module 714 is then input into fine puncturing module 716. Fine puncturing module 718 also receives puncture index 718 as an input. The output of fine puncturing module 718 is a set of parity bits 720. The parity bits 720 and K systematic bits 722, which represent the data portion of the message, are transmitted across the communication channel to the receiver.

The F-LDPC is a rate-compatible systematic code that can generate as many as 2K parity bits for an input message block of K bits, resulting in a minimum code-rate of $R_{min}=\frac{1}{3}$. A fine set of higher code-rates is obtained by periodically puncturing the set of 2K parity bits using two-level (coarse- and fine-) puncturing. The coarse-puncturing simply punctures the first J-1 bits out of every group of J parity bits, where J can take on the values 1, 2, 4, 8, 16, 32. There are 2K/J non-punctured parity bits remaining after coarse puncturing. If J=1, coarse puncturing is disabled. The resulting non-punctured parity sequence is further punctured using one of eight periodic fine-puncturing patterns of length 16. The fine puncturing patterns used in the experiments are given by $F_0=(1,1,1,1,1,1,1,1,1,1,1,1,1,1,1,1)$
$F_1=(0,1,1,1,1,1,1,1,1,1,1,1,1,1,1,1)$
$F_2=(0,1,1,1,1,1,1,1,0,1,1,1,1,1,1,1)$
$F_3=(0,1,1,1,0,1,1,1,0,1,1,1,1,1,1,1)$
$F_4=(0,1,1,1,0,1,1,1,0,1,1,1,0,1,1,1)$
$F_5=(0,1,0,1,0,1,1,1,0,1,1,1,0,1,1,1)$
$F_6=(0,1,0,1,0,1,1,1,0,1,0,1,0,1,1,1)$
$F_7=(0,1,0,1,0,1,0,1,0,1,0,1,0,1,1,1)$ where a '0' value indicates that bit position is punctured. Pattern $F_k$ punctures k bits out of 16, for q=0, 1, 2, ... 7. With $F_0$, there is no fine-puncturing.

The coarse- and fine-puncturing stages yields 48 code rates between $R_{min}=1/3$ and $R_{max}=256/265$. The code-rate can be computed from the J value and the puncturing index q (which determines the fine-puncturing pattern $F_q$) as:

$$R(J, q) = \frac{J}{J+2\left(1-\frac{q}{16}\right)} \quad (2.4.1)$$

For example, for J=1, q=4, R=2/5.

For simulation of throughput performance, the output of the F-LDPC is mapped onto the binary signal set $\{-1,+1\}$. Let $\{c_j\}$ denote the output from the F-LDPC in a particular transmission, and $\{x_j\}$ denote the corresponding transmitted signal, where $x_j=1$ if $c_j=0$, and $x_j=-1$ if $c_j=1$. Two channel models are considered.

The additive-white-Gaussian noise (AWGN) channel corrupts the transmitted signal by adding independent noise samples to each $x_j$ where each noise sample has a Gaussian distribution with a mean of zero and standard deviation of $\sigma_w$. The channel input-output relationship is therefore given by $$y_j = x_j + w_j \quad (2.4.2)$$

where $\{w_j\}$ is the noise sequence. In accordance with (1.1) the decoder input LLR values are then given by $$\lambda_j = \frac{2y_j}{\sigma_W^2} \quad (2.4.3)$$

The AWGN channel idealizes a scenario where the channel is static, which is rarely the case in wireless communications where the channel diminishes the received signal strength in a time-varying fashion.

The varying signal-strength is often represented by a multiplicative factor called the channel gain, or channel fade. The mathematical model for this scenario is given by $$y_j = h_j x_j + w_j \quad (2.4.4a)$$

where $h_j$ is the channel gain for symbol j.

A simple first-order autoregressive model for the time-varying nature of the channel gain is $$h_j = \rho h_{j-1} + n_j \quad (2.4.4b)$$

where $\rho$ is the correlation coefficient between adjacent channel gain values and $\{n_j\}$ is a sequence of independent samples from a Gaussian distribution with mean zero and variance $1-\rho^2$. A shorthand notation for this model is $AR1(\rho)$.

With perfect knowledge of the channel gains at the receive-end, the decoder input LLR values are given by $$\lambda_j = \frac{2h_j y_j}{\sigma_W^2} \quad (2.4.5)$$

The AWGN channel can be obtained from equations (2.4.4a)-(2.4.5) by setting $h_j=1$. For both the AWGN and the AR1 channel, the channel signal-to-noise ratio (SNR) is defined in decibels as $$SNR(dB) = 10\log_{10}\left(\frac{2}{\sigma_W^2}\right) \quad (2.4.6)$$

For experiments with the time-varying channel models, a period of $D_{ACK}$ symbols is used to model the time from the time the decoder issues an ACK/NAK to the time the next decoding epoch starts. During this period, the channel continues to change according to (2.4.4). Each ACK/NAK is assumed to be of length 16 bits, which is factored into the throughput computation.

Error-detection mechanism producing the ACK/NAK messages is assumed to be ideal with no miss of block errors. The throughput penalty of the error-detection bits for each block of data is assumed to be $k_{ED}=16$ bits.

In all experiments, the rate-adapter described by equations (2.3.1a) and (2.3.1b) (with $\alpha=2$) is used.

Figure 8:
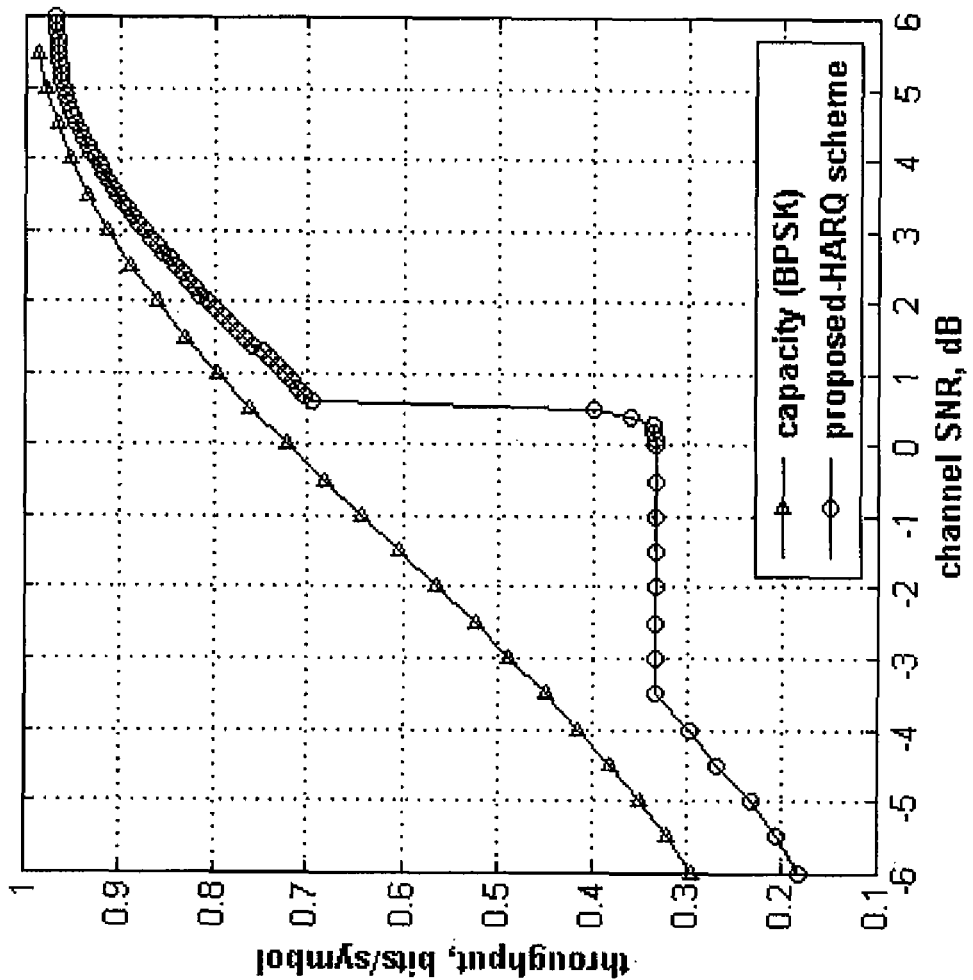
FIG. 8 is chart illustrating a comparison of the throughput of the incremental-decremental redundancy scheme shown in FIG. 6 in comparison to capacity with binary signal sets in AWGN, as a function of the channel SNR.

FIG. 8 is a chart that depicts the throughput of the incremental-decremental redundancy scheme described in Section 2.3 for the AWGN channel as a function of channel SNR K=1024 bits, as well as the maximum throughput possible with a binary signal set, labeled as capacity, according to an embodiment of the disclosure. At SNRs less than −3.5 dB, the transmitted block is in error with high probability even with rate-1/3 encoding, resulting in requests for retransmissions of the data block, therefore the throughput is less than 1/3. For SNR values between −3.5 dB and 0.5 dB, channel conditions are good enough for rate-1/3 encoding, but not any higher. With increasing SNR, successful decoding with higher code-rates becomes statistically significant and the throughput increases. At high SNR, almost all blocks can be transmitted successfully with the highest code-rate, and the throughput of the practical scheme converges to a value very close to $R_{max}=256/265\approx0.966$ bits per symbol.

Figure 9:
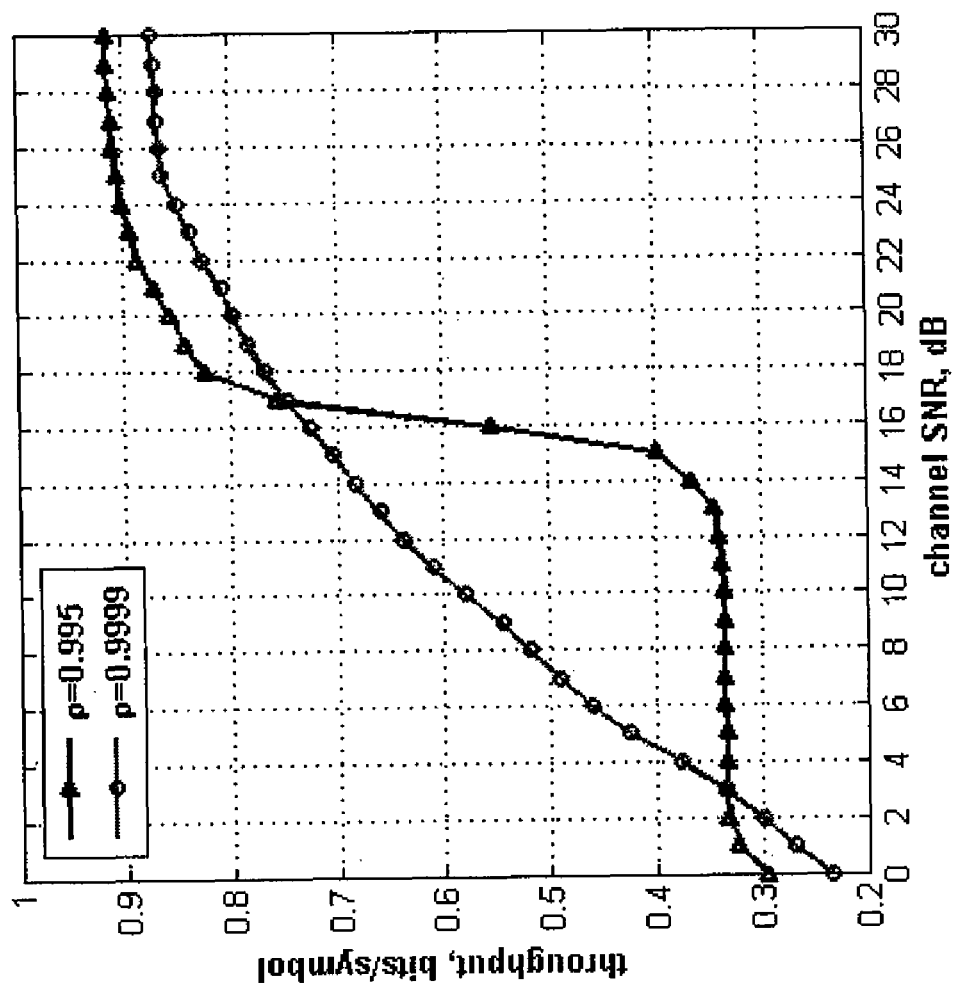
FIG. 9 is a chart illustrating the throughput of the incremental-decremental redundancy scheme—over two AR1 channels.
Figure 10:
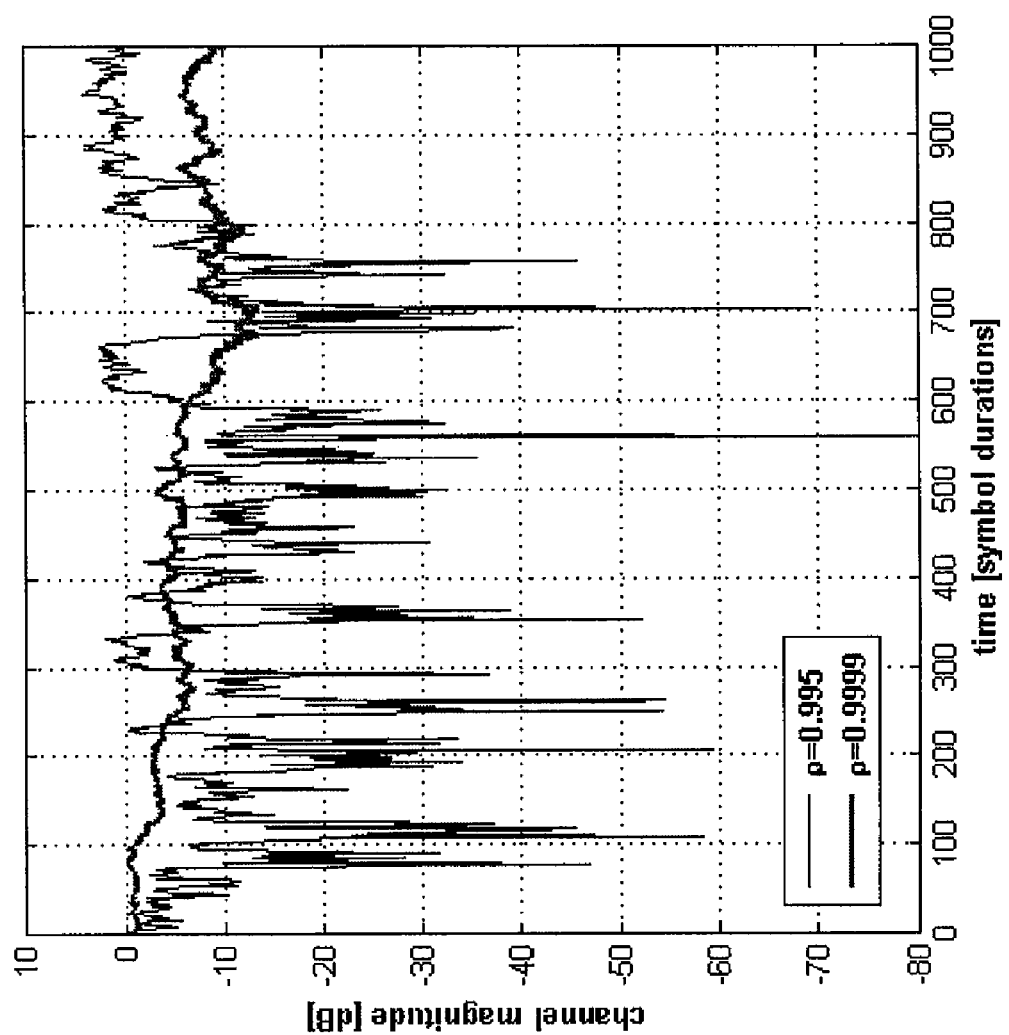
FIG. 10 is a chart illustrating sample channel-gain sequences for two AR1 channels.

FIG. 9 is a chart depicting the throughput numbers for two different AR1 scenarios. For the slowly-varying AR1 channel, $\rho=0.9999$. For the faster-varying channel, $\rho=0.995$. Sample channel-gain sequences are plotted in FIG. 10, illustrating the dynamics of the channel for both cases, according to an embodiment of the disclosure.

While the embodiments described above may make reference to specific hardware and software components, those skilled in the art will appreciate that different combinations of hardware and/or software components may also be used and that particular operations described as being implemented in hardware might also be implemented in software or vice versa.

Computer programs incorporating various features of the disclosure may be encoded on various computer readable media for storage and/or transmission; suitable media include magnetic disk or tape, optical storage media such as compact disk (CD) or DVD (digital versatile disk), flash memory, and the like. Such programs may also be encoded and transmitted using carrier signals adapted for transmission via wired, optical, and/or wireless networks conforming to a variety of protocols, including the Internet. Computer readable media encoded with the program code may be packaged with a compatible device or provided separately from other devices (e.g., via Internet download).

Thus, although the invention has been described with respect to specific embodiments, it will be appreciated that the invention is intended to cover all modifications and equivalents within the scope of the following claims.

What is claimed is:

1. A method for transmitting data, the method comprising:
   transmitting a first set of data encoded at a first data rate to a receiver, wherein the first set of data includes a first number of data bits and a first number of parity bits;
   receiving a first estimated number of bit errors for the first set of data from the receiver;
   determining a first instantaneous bit error rate (BER) for the first set of data based upon the estimated number of bit errors received from the receiver;
   determining a second data rate as a function of the first data rate and the first instantaneous BER, wherein if the first instantaneous BER indicates that no errors occurred in transmission, the second data rate includes less redundancy that the first data rate; and
   transmitting a second set of data encoded at the second data rate to the receiver.

2. The method of claim 1 wherein the first set of data and the second set of data are encoded with a binary forward error correction (FEC) code.

3. The method of claim 1 wherein determining the first instantaneous BER comprises dividing the first estimated number of bit errors by the first number of data bits in the first set of data.

4. The method of claim 1 wherein the second data rate is equal to $(R_0(1-\mu_{E,EST}))/(1-R_0\mu_{E,EST})$, wherein $R_0$ represents the first data rate and $\mu_{E,EST}$ represents the first instantaneous BER.

5. The method of claim 1 wherein the second data rate is equal to $R_0(1-\mu_{E,EST})$, wherein $R_0$ represents the first data rate and $\mu_{E,EST}$ represents the first instantaneous BER.

6. The method of claim 1 wherein the second data rate is also a function of the first number of data bits, the first number of parity bits, and the first estimated number of bit errors.

7. The method of claim 6 wherein the second data rate is equal to $(K-K_{E,EST})/(K+P_0)$, wherein $P_0$ represents the first number of parity bits, $K_{E,EST}$ represents the first estimated number of bit errors, and K represents the first number of data bits.

8. The method of claim 1 further comprising:
   prior to transmitting the second set of data, determining that the second data rate is less than a minimum data rate; and
   transmitting the second set of data to the receiver at the minimum data rate.

9. The method of claim 1 further comprising:
   prior to transmitting the second set of data, determining that the second data rate is greater than a minimum data rate;
   determining that the first instantaneous BER exceeds an error rate threshold; and
   determining an additional number of parity bits, such that when the additional number of parity bits are combined with the first number of parity bits, an effective data rate for the first set of data is approximately equal to the second data rate; and
   transmitting the additional number of parity bits to the receiver.

10. The method of claim 9, wherein the additional number of parity bits is equal to $P_0(\mu_{E,EST}/(1-\mu_{E,EST}))$, and wherein $P_0$ represents the first number of parity bits, and $\mu_{E,EST}$ represents first instantaneous BER.

11. The method of claim 9, wherein the additional number of parity bits is equal to $(P_0+K)(\mu_{E,EST}/(1-\mu_{E,EST}))$, and wherein $P_0$ represents the first number of parity bits, $\mu_{E,EST}$ represents first instantaneous BER, and K represents the first number of data bits.

12. The method of claim 1 wherein the first set of data and the second set of data are encoded with a non-binary forward error correction (FEC) code, and wherein a first instantaneous symbol error rate (SER) is determined and $\mu_{E,EST}$ represents the first instantaneous SER.

13. The method of claim 12 wherein the second data rate is equal to $(R_0(1-\mu_{E,EST}))/(M-R_0(M-1))$ wherein M is equal to $\log|F_c|/\log|F_b|$, wherein $F_c$ is a size of an encoder input alphabet and $F_b$ is a size of an encoder output alphabet, and wherein $R_0$ represents the first data rate.

14. The method of claim 1 wherein the first estimated number of bit errors is equal to ceil $(K \cdot \mu_{E,EST})$ wherein K represents the first number of data bit errors and $\mu_{E,EST}$ represents the first instantaneous BER, wherein ceil $(K \cdot \mu_{E,EST})$ is the smallest integer greater than or equal to $(K \cdot \mu_{E,EST})$, and wherein the first set of data is estimated to be error free if the first estimated number of bit errors is less than $(1/K)$.

15. The method of claim 1 wherein determining the second data rate as a function of the first data rate and the first instantaneous BER comprises:
   determining a proposed rate, wherein the proposed rate is equal to $(R_0(1-\mu_{E,EST}))/(M-R_0(M-1))$, wherein M=1 if the first set of data is encoded with a binary code, and wherein $M=,\log|F_c|/\log|F_b|$, where $F_c$ is a size of an encoder input alphabet and $F_b$ is the size of a encoder output alphabet, if the first set of data is encoded with a non-binary code, wherein $R_0$ represents the first data rate and $\mu_{E,EST}$ represents the first instantaneous BER;
   selecting a larger of the proposed rate and a minimum data rate ($R_{min}$) as the second data rate.

16. The method of claim 15 wherein if the first set of data is encoded with the non-binary code, an instantaneous symbol error rate (SER) is determined and $\mu_{E,EST}$ represents the instantaneous SER.

17. The method of claim 1 wherein determining a data rate that includes less redundancy than the first data rate comprises:
   determining an estimated signal to noise ratio of the first set of data received by the receiver;
   determining a proposed rate parameter based upon the first data rate, the estimated signal to noise ratio, and a greediness level exponent value;
   determining the second data rate based upon the product of the first number of data bits in the first set of data and the results from a standard Gaussian tail integral function computed using the proposed rate parameter.

18. A receiver configured to:
   receive a first set of data encoded at a first data rate from a transmitter, wherein the first set of data includes a first number of data bits and a first number of parity bits;
   determine a bit-decision metric for each bit comprising the first set of data
   compare the bit-decision metric for each bit to a threshold value;
   assign a value to each bit based upon comparison of the bit-decision metric to the threshold value;

determine a first estimated number of bit errors for the first set of data received by the receiver;

determine a first instantaneous bit error rate (BER) for the first set of data based upon the first estimated number of bit errors;

determine a second data rate as a function of the first data rate and the first instantaneous BER;

transmit a feedback message to the transmitter indicating the second data rate; and receive a second set of data from the transmitter encoded at the second data rate.

19. The receiver of claim 18 wherein the first instantaneous BER is determined based upon an estimated signal to noise ratio of the first set of data received by the receiver.

20. The receiver of claim 19 wherein the first instantaneous BER equals a standard Gaussian tail integral of a square root of the estimated signal to noise ratio.

21. The receiver of claim 19 wherein the estimated signal-to-noise ratio comprises:

a coarse estimate for mean and standard deviation parameters of a Gaussian mixture density model for decision variables.

22. The receiver of claim 19 further configured to approximate a solution to a modified log-likelihood-ratio (LLR) function to determine the value of each bit of the first set of data.

23. The receiver of claim 19 wherein the estimated signal-to-noise ratio is determined iteratively using mean and standard deviation values with an expectation-maximization algorithm.

24. The receiver of claim 19 further configured to determine the estimated signal to noise ratio using a coarse estimated signal to noise ratio.

25. The receiver of claim 24 further configured to determine the coarse estimated signal to noise ratio by:

determining an estimated mean parameter;

determining an estimated standard deviation parameter; and dividing a square of the estimated mean parameter by a square of the estimated standard deviation parameter.

26. The receiver of claim 19 further configured to determine the estimated signal to noise ratio using a fine estimated signal to noise ratio.

27. The receiver of claim 26 further configured to determine the fine estimated signal to noise ratio by:

iteratively determining a fine estimated mean parameter and a fine estimated standard deviation parameter; and dividing a square of the fine estimated mean parameter by a square of the fine estimated standard deviation parameter.

28. The receiver of claim 18 further configured to determine the value of each bit of the first set of data using a modified log-likelihood-ratio (LLR) function to determine a value of each word of the first set of data, the modified LLR function using a log-ratio of a probability of a most-likely symbol to a sum of probabilities of symbols other than the most-likely symbol.

29. The receiver of claim 18 further configured to determine the value of each bit of the first set of data using a modified log-likelihood-ratio (LLR) function to determine a value of each word of the first set of data, the modified LLR function using a log-ratio of a probability of a most-likely symbol to a probability of a second most-likely symbol.

30. A system for data communication, the system comprising:

a receiver; and a transmitter configured to transmit data to the receiver across a communication channel;

wherein the transmitter is configured to:

transmit a first set of data encoded at a first data rate to the receiver, wherein the first set of data includes a first number of data bits and a first number of parity bits;

receive feedback data including a second data rate from the receiver; and transmit a second set of data encoded at the second data rate to the receiver;

wherein the receiver is configured to:

receive the first set of data encoded at the first data rate from the transmitter;

determine a first estimated number of bit errors for the first set of data;

determine a first instantaneous bit error rate for the first set of data based upon the estimated number of bit errors in the first set of data;

determine the second data rate as a function of the first data rate and the first instantaneous bit error rate, wherein if the first instantaneous bit error rate indicates that no errors occurred, the second data rate includes less redundancy that the first data rate;

transmit the feedback data including the second data rate to the transmitter; and receive the second set of data from the transmitter encoded at the second data rate.

\* \* \* \* \*